United States Patent
Kato et al.

(10) Patent No.: US 7,915,647 B2
(45) Date of Patent: Mar. 29, 2011

(54) SEMICONDUCTOR INTEGRATED CIRCUIT

(75) Inventors: Yoshiko Kato, Yokohama (JP);
Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 11/858,634

(22) Filed: Sep. 20, 2007

(65) Prior Publication Data

US 2008/0073672 A1    Mar. 27, 2008

(30) Foreign Application Priority Data

Sep. 21, 2006  (JP) ................................ 2006-256012

(51) Int. Cl.
*H01L 27/10* (2006.01)

(52) U.S. Cl. .... 257/210; 257/208; 257/202; 257/E23.01

(58) Field of Classification Search .................. 257/758, 257/E23.079; 365/63
See application file for complete search history.

(56) References Cited

U.S. PATENT DOCUMENTS

| | | | | |
|---|---|---|---|---|
| 4,021,789 | A | * | 5/1977 | Furman et al. ................. 365/182 |
| 4,716,452 | A | * | 12/1987 | Kondoh et al. ................. 257/210 |
| 4,767,936 | A | * | 8/1988 | Murakami et al. ............ 358/482 |
| 5,160,995 | A | * | 11/1992 | Wada et al. .................... 257/207 |
| 5,223,733 | A | * | 6/1993 | Doi et al. ....................... 257/386 |
| 5,260,698 | A | * | 11/1993 | Munetsugu et al. ........... 345/205 |
| 5,365,406 | A | * | 11/1994 | Kurashima .................... 361/777 |
| 5,572,480 | A | * | 11/1996 | Ikeda et al. ............... 365/230.06 |
| 5,767,554 | A | * | 6/1998 | Ikeda et al. .................... 257/393 |
| 6,110,753 | A | | 8/2000 | Nakamura |
| 6,144,084 | A | * | 11/2000 | Sanada .......................... 257/443 |
| 6,317,353 | B1 | * | 11/2001 | Ikeda et al. ...................... 365/63 |
| 6,495,870 | B1 | * | 12/2002 | Sekiguchi et al. ............ 257/208 |
| 6,534,803 | B2 | | 3/2003 | Ohkubo |
| 6,853,029 | B2 | | 2/2005 | Ichige et al. |
| 7,045,423 | B2 | | 5/2006 | Ichige et al. |
| 2001/0040792 | A1 | * | 11/2001 | Crane et al. ................... 361/730 |
| 2002/0000592 | A1 | * | 1/2002 | Fujiwara ....................... 257/296 |
| 2002/0130714 | A1 | * | 9/2002 | Riho et al. ..................... 327/565 |
| 2003/0235091 | A1 | * | 12/2003 | Sekine et al. ................. 365/200 |

(Continued)

FOREIGN PATENT DOCUMENTS

JP   3-88200   4/1991

(Continued)

OTHER PUBLICATIONS

U.S. Appl. No. 12/164,486, filed Jun. 30, 2008, Kato et al.

*Primary Examiner* — Leonardo Andújar
*Assistant Examiner* — William Harriston
(74) *Attorney, Agent, or Firm* — Oblon, Spivak, McClelland, Maier & Neustadt, L.L.P.

(57) ABSTRACT

A nonvolatile semiconductor memory concerning an example of the present invention comprises a cell array, a plurality of conducting wires extending from the cell array to a lead area, and a plurality of contact holes to arranged in the lead area so that a distance from the end of the cell array sequentially increases from one to the other of the plurality of conducting wires, each of the plurality of conducting wires having a first conducting wire portion having a first conducting wire width, a second conducting wire portion connected to the contact hole and having a second conducting wire width smaller than the first conducting wire width, and a third conducting wire portion electrically connecting the first conducting wire portion to the second conducting wire portion.

20 Claims, 11 Drawing Sheets

U.S. PATENT DOCUMENTS

| | | | |
|---|---|---|---|
| 2004/0076068 A1* | 4/2004 | Yamada et al. | 365/232 |
| 2004/0105321 A1* | 6/2004 | Kuo et al. | 365/200 |
| 2004/0166630 A1* | 8/2004 | Ogura et al. | 438/257 |
| 2005/0063238 A1* | 3/2005 | Nambu et al. | 365/222 |
| 2005/0104109 A1* | 5/2005 | Wu et al. | 257/301 |
| 2005/0146925 A1* | 7/2005 | Hidaka | 365/171 |
| 2005/0157221 A1* | 7/2005 | Kim | 349/43 |
| 2005/0173751 A1 | 8/2005 | Ishii et al. | |
| 2005/0218522 A1* | 10/2005 | Nomoto et al. | 257/758 |
| 2005/0285174 A1* | 12/2005 | Saito et al. | 257/296 |
| 2006/0035451 A1* | 2/2006 | Hsu | 438/592 |
| 2006/0285384 A1* | 12/2006 | Lojek | 365/185.01 |
| 2007/0147128 A1* | 6/2007 | Edahiro | 365/185.21 |
| 2007/0170589 A1 | 7/2007 | Kato et al. | |
| 2008/0006869 A1* | 1/2008 | Kamigaichi et al. | 257/315 |
| 2008/0212361 A1* | 9/2008 | Bertin et al. | 365/151 |
| 2008/0251933 A1* | 10/2008 | Cho et al. | 257/775 |
| 2009/0231913 A1* | 9/2009 | Tonomura et al. | 365/163 |

FOREIGN PATENT DOCUMENTS

| | | |
|---|---|---|
| JP | 4-346470 | 12/1992 |
| JP | 2002-151601 | 5/2002 |
| JP | 2003-86720 | 3/2003 |
| JP | 2004-15056 | 1/2004 |

* cited by examiner

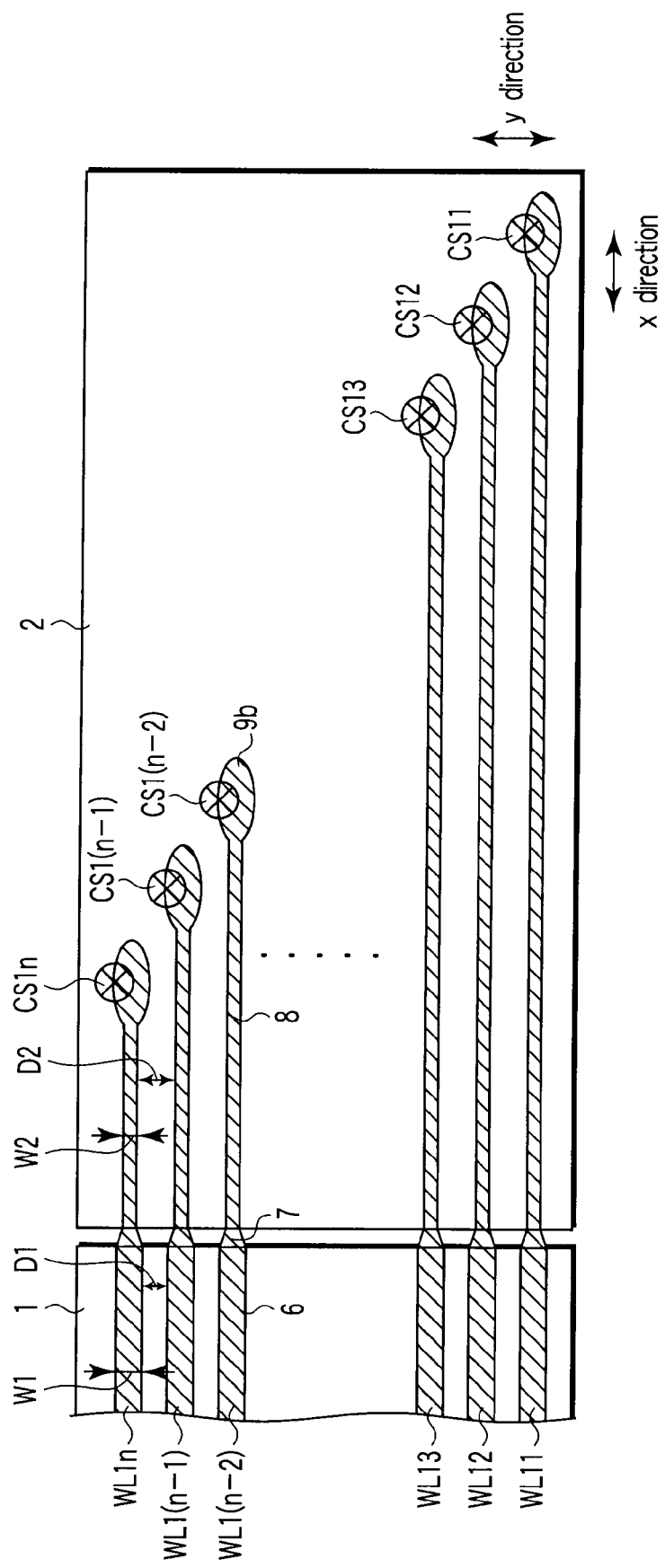
F I G. 5

SEMICONDUCTOR INTEGRATED CIRCUIT

CROSS-REFERENCE TO RELATED APPLICATIONS

This application is based upon and claims the benefit of priority from prior Japanese Patent Application No. 2006-256012, filed Sep. 21, 2006, the entire contents of which are incorporated herein by reference.

BACKGROUND OF THE INVENTION

1. Field of the Invention

The present invention relates to the layout of conducting wires of a semiconductor memory, and is used, for example, for a semiconductor memory requiring a higher storage capacity.

2. Description of the Related Art

Recently, nonvolatile semiconductor memories such as NAND-type flash memories have been used as storage units in various electronic devices.

Higher storage capacities of the NAND-type flash memories are desired along with increasing functions of the electronic devices.

The NAND-type flash memory comprises a memory cell array section in which memory cells are formed, and a peripheral circuit section disposed on the periphery of the memory cell array section, and chip layout is extremely important for a higher memory capacity.

For example, while the miniaturization of the memory cells is prominently developing, misalignment during photolithography has to be taken into account to determine the sizes and pitches of conducting wires and contact holes in order to prevent the breaking and short circuit of the conducting wires and to improve reliability (e.g., refer to Jpn. Pat. Appln. KOKAI Publication No. 2002-151601).

For example, even if word lines are formed with minimum processing dimensions within a memory cell array by a line-and-space pattern, for example, lead wires made of a metal are required to connect the word lines to a word line driver.

Therefore, there is a necessity for a region to connect the word lines to the lead wires, and a word line lead area has to be secured on the periphery of the memory cell array.

Thus, considering a wiring line layout in the lead wire area is important to reduce the chip size of the NAND-type flash memory and improve its reliability.

Moreover, such a problem is not limited to the NAND-type flash memories, and a similar problem arises in a semiconductor integrated circuit such as a DRAM having a line-and-space wiring line structure.

The present invention proposes a technique for preventing the short circuit of conducting wires having a line-and-space pattern and reducing a chip size.

BRIEF SUMMARY OF THE INVENTION

A semiconductor integrated circuit concerning an example of the present invention comprises: a cell array composed of a plurality of blocks in which a plurality of elements are arrayed; a plurality of conducting wires extending from the cell array to a lead area; and a plurality of contact holes arranged in the lead area so that a distance from the end of the cell array sequentially increases from one to the other of the plurality of conducting wires, each of the plurality of conducting wires having: a first conducting wire portion having a first conducting wire width; a second conducting wire portion connected to the contact hole and having a second conducting wire width smaller than the first conducting wire width; and a third conducting wire portion electrically connecting the first conducting wire portion to the second conducting wire portion.

BRIEF DESCRIPTION OF THE SEVERAL VIEWS OF THE DRAWING

FIG. 5 is a diagram showing one example of the layout of the word lines in the lead area;

DETAILED DESCRIPTION OF THE INVENTION

Several modes for carrying out examples of the present invention will hereinafter be described in detail with reference to the drawings.

1. Outline

Embodiments of the present invention concern a layout in which a plurality of conducting wires arranged on a memory cell array and having a line-and-space pattern are in a single-edged shape at one end, characterized in that the width of conducting wires connected to contact holes disposed in a conducting wire lead area is smaller than the width of the conducting wires on the memory cell array.

The reduced width of the conducting wires in the conducting wire lead area ensures a large distance between the conducting wires in the lead area.

This makes it possible to prevent the short circuit between the conducting wires and a loose connection between the conducting wire and a lead wire.

Furthermore, the reduction of the width of the conducting wire permits a smaller area occupied by the conducting wire lead area. This permits a reduced chip size and a higher storage capacity.

In addition, the single-edged layout means the layout of a plurality of conducting wires in which a distance from the end of the memory cell array sequentially increases from one to the other of the plurality of conducting wires. Such a layout is employed for each block, for example, when the memory cell array is constituted of a plurality of blocks, so that the plurality of conducting wires have a sawtooth appearance at one end in the whole memory cell array. When a slanting part is regarded as an edge, its shape can be called a single-edged shape, so that the layout of the conducting wires described above will hereinafter be referred to as the single-edged layout.

2. Embodiments

Next, a flash memory is explained by way of example in connection with several embodiments.

(1) First Embodiment

Figure 1:
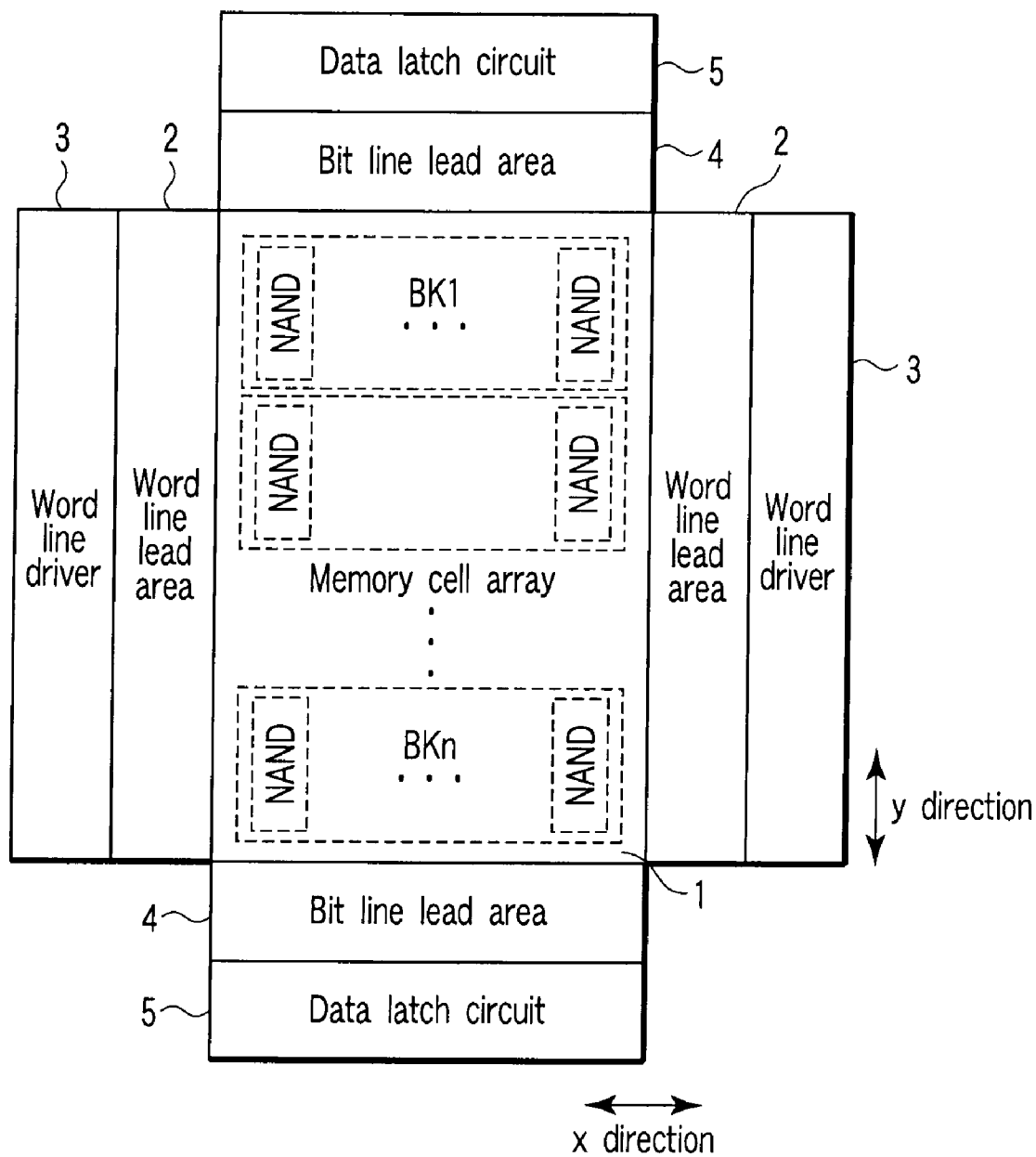
FIG. 1 is a schematic diagram for explaining places to which embodiments of the present invention are applied.

FIG. 1 is a schematic diagram showing the configuration of a flash memory for explaining the embodiments of the present invention. It is to be noted that FIG. 1 shows the configuration of a NAND type flash memory.

A memory cell array section 1 is constituted of a plurality of blocks BK1, BK2, ..., BKn. Each of the plurality of blocks BK1 to BKn has a plurality of NAND cell units.

A word line driver 3 drives word lines in the block selected during read/write.

A data latch circuit 5 has a function of temporarily latching data during read/write.

Furthermore, a word line lead area 2 is provided between a memory cell array 1 and the word line driver 3 as a region for connecting lead wires to the word lines, and a bit line lead area 4 is provided between the memory cell array 1 and the data latch circuit 5 as a region for connecting the lead wires to bit lines. The word line lead areas 2 have the memory cell array 1 in between, and are arranged symmetrically in an x-direction in the diagram. On the other hand, the bit line lead areas 4 also have the memory cell array 1 in between, and are arranged symmetrically in a y-direction in the diagram.

The layout of the word lines extending from the memory cell array 1 to the word line driver 3 is explained below.

Figure 2:
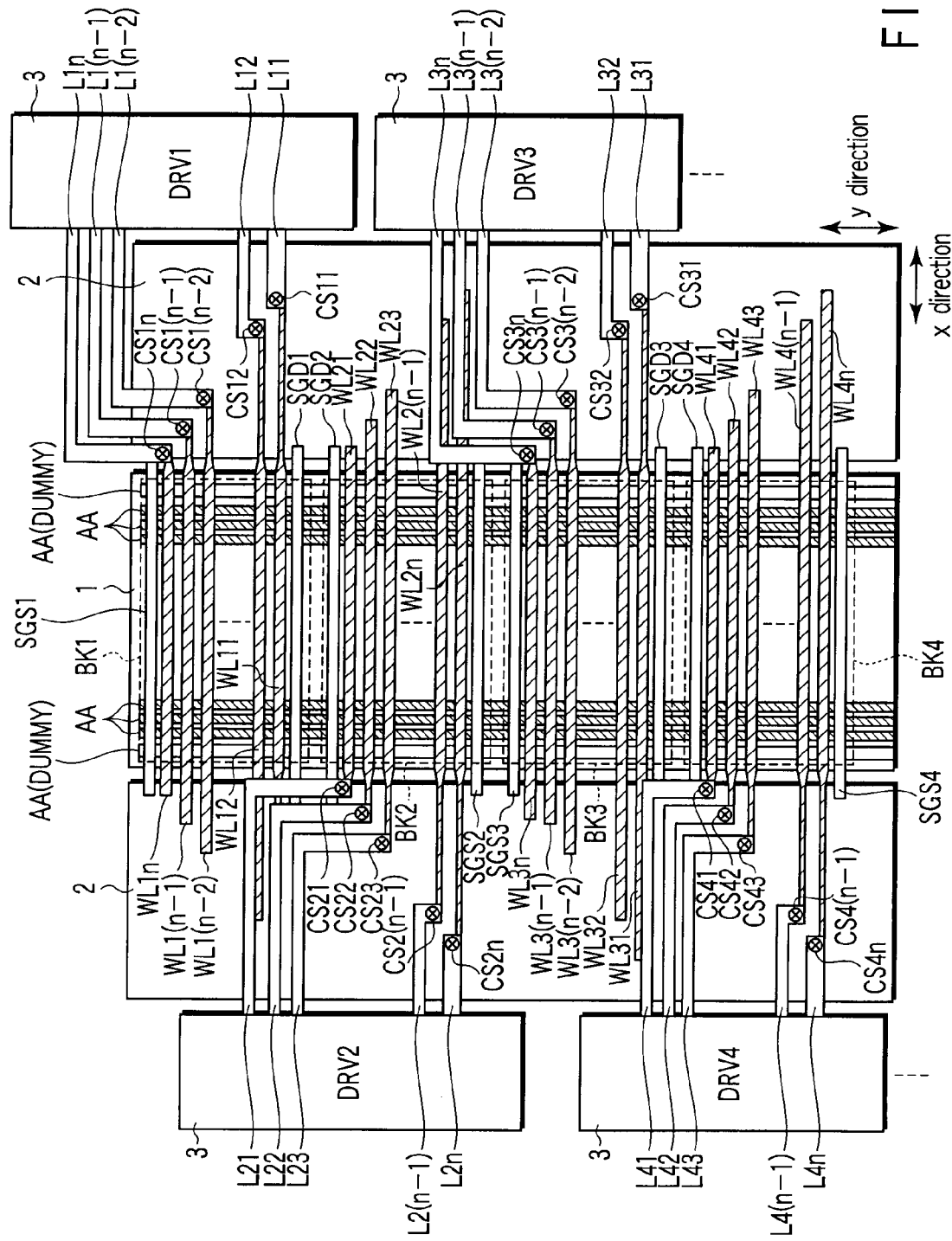
FIG. 2 is a diagram showing a layout in a first embodiment.

FIG. 2 shows the layout of the word lines in the present embodiment.

The plurality of blocks BK1 to BK4 in the memory cell array 1 are arranged adjacent to one another in the y-direction. Each of the plurality of blocks BK1 to BK4 has the NAND cell units arranged in active areas AA.

A plurality of active areas AA are arranged adjacent to one another in the x-direction of the memory cell array 1.

The NAND cell unit comprises a NAND string constituted of a plurality of memory cell transistors, and selection transistors SGS1 to SGS4 arranged on the source side of the NAND string, and selection transistors SGD1 to SGD4 arranged on the drain side of the NAND string.

The memory cell transistor constituting the NAND string is a memory cell transistor having a stacked gate structure using, for example, a floating gate electrode as a charge accumulation layer, or a memory cell transistor having a MONOS structure using, for example, a silicon nitride film as a charge accumulation layer.

Dummy active areas AA (DUMMY) are arranged at extreme ends of the plurality of blocks BK1 to BK4 in the x-direction.

The dummy active area AA (DUMMY) is constituted of one or more active areas AA, so that NAND cell units are also arranged as in the active area AA. Owing to the provision of the dummy active areas AA (DUMMY), an actual device provided inside the areas AA (DUMMY) is free of cell characteristic deterioration due to processing strain at a pattern end as compared with the case where the actual device is located at the pattern end. In addition, memory cells in the dummy active areas AA (DUMMY) are not used to store data.

The plurality of blocks BK1 to BK4 has a plurality of word lines WL11 to WL1$n$, WL21 to WL2$n$, WL31 to WL3$n$ and WL41 to WL4$n$, respectively.

The word line drivers 3 (DRV1 to DRV4) have a plurality of lead wires L11 to L1$n$, L21 to L2$n$, L31 to L3$n$ and L41 to L4$n$, respectively. These lead wires are configured to correspond to the plurality of word lines WL11 to WL1$n$, WL21 to WL2$n$, WL31 to WL3$n$ and WL41 to WL4$n$.

The plurality of lead wires L11 to L1$n$, L21 to L2$n$, L31 to L3$n$ and L41 to L4$n$ are formed in a layer higher than a layer where the plurality of word lines WL11 to WL1$n$, WL21 to WL2$n$, WL31 to WL3$n$ and WL41 to WL4$n$ are formed, and these lead wires are therefore connected to the plurality of word lines WL11 to WL1$n$, WL21 to WL2$n$, WL31 to WL3$n$ and WL41 to WL4$n$ via a plurality of contact holes CS11 to CS1$n$, CS21 to CS2$n$, CS31 to CS3$n$ and CS41 to CS4$n$ provided in the word line lead area 2.

Furthermore, the word line drivers 3 correspond to the blocks BK1 to BK4, and are arranged equally at both ends of the memory cell array 1 because it is difficult for one word line driver to be contained within the width of one block in the y-direction.

Therefore, odd blocks (BK1, BK3) are structured with the same wiring layout and even blocks (BK2, BK4) are structured with the same wiring layout for the word line drivers 3 (DRV1 to DRV4) of the blocks BK1 to BK4, and the odd blocks are symmetrical with the even blocks. Thus, here, the wiring layout of the block BK1 is explained below as an example.

The plurality of word lines WL11 to WL1$n$ extend in the x-direction on the memory cell array 1, and these word lines reside at one end and the other to have a single-edged shape in the word line lead areas 2 between the memory cell array 1 and the word line drivers 3.

The width of the one end the plurality of word lines WL11 to WL1$n$ is converted at the extreme end of the memory cell array 1, so that the width of the word lines is smaller in the word line lead area 2 than in the memory cell array 1. On the other hand, the plurality of word lines WL11 to WL1$n$ is shaped at the other end to have the same width in the word line lead area 2 as the width in the memory cell array 1.

The plurality of lead wires L11 to L1$n$ connecting the plurality of word lines WL11 to WL1$n$ to the word line driver 3 are arranged in the word line lead area 2.

The width of the plurality of lead wires L11 to L1$n$ is larger than the width of the plurality of word lines WL11 to WL1$n$.

The plurality of lead wires L11 to L1$n$ are made of a metal such as Al, Cu or W, or an alloy.

The plurality of contact holes CS11 to CS1$n$ are disposed at one end of the plurality of word lines WL11 to WL1$n$.

The sizes of the plurality of contact holes CS11 to CS1$n$ are larger than the width of the plurality of word lines WL11 to WL1$n$. In addition, the size of the contact hole is its diameter when the shape of the contact hole is circular. Moreover, the size of the contact hole is the length of its one side when the shape of the contact hole is foursquare.

In addition, the plurality of word lines WL11 to WL1$n$ are single-edged at one end and the other, so that even if the sizes of the plurality of contact holes CS11 to CS1$n$ are large, no breaking and short circuit occur due to misalignment during photolithography.

Figure 3:
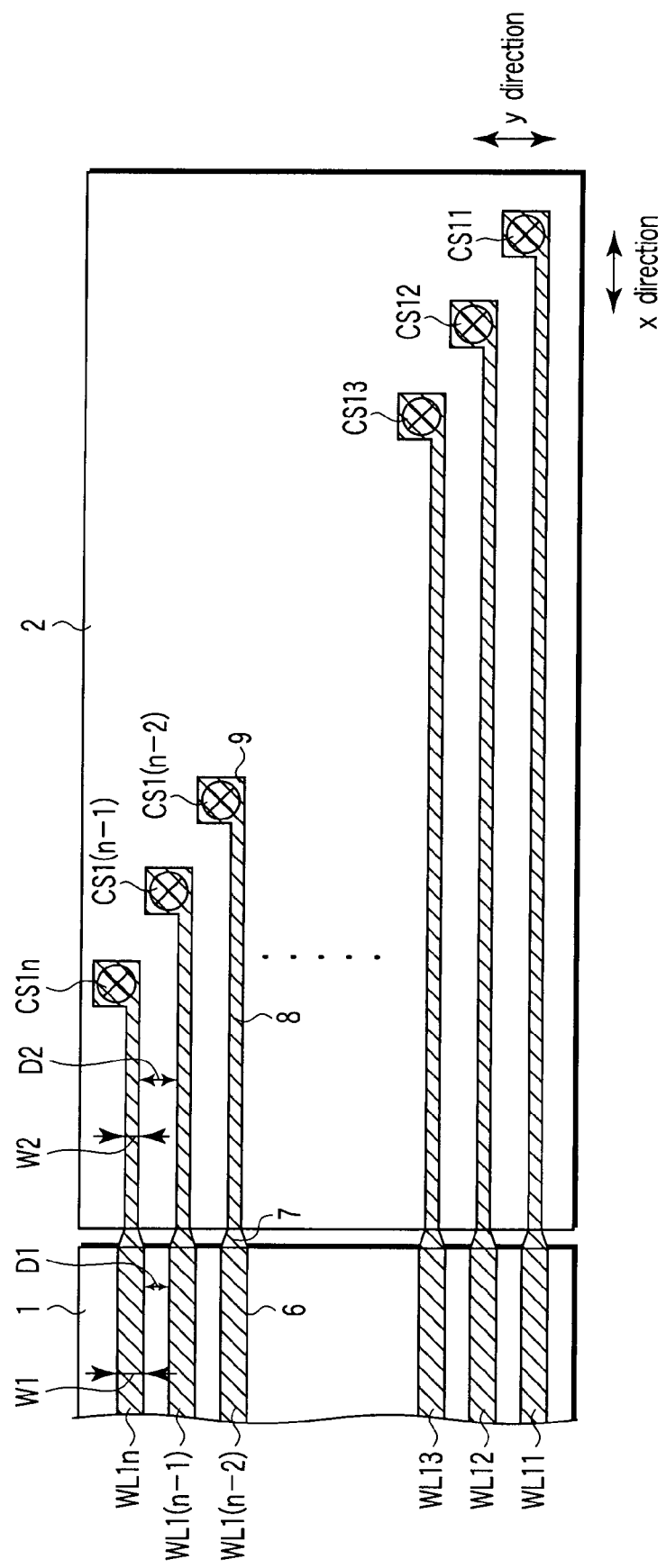
FIG. 3 is a diagram showing one example of the layout of word lines in a lead area.

Furthermore, as shown in FIG. 3, the plurality of word lines WL11 to WL1$n$ are provided with fringes 9 at one end to take into account the misalignment with the plurality of contact holes CS11 to CS1$n$.

Figure 4:
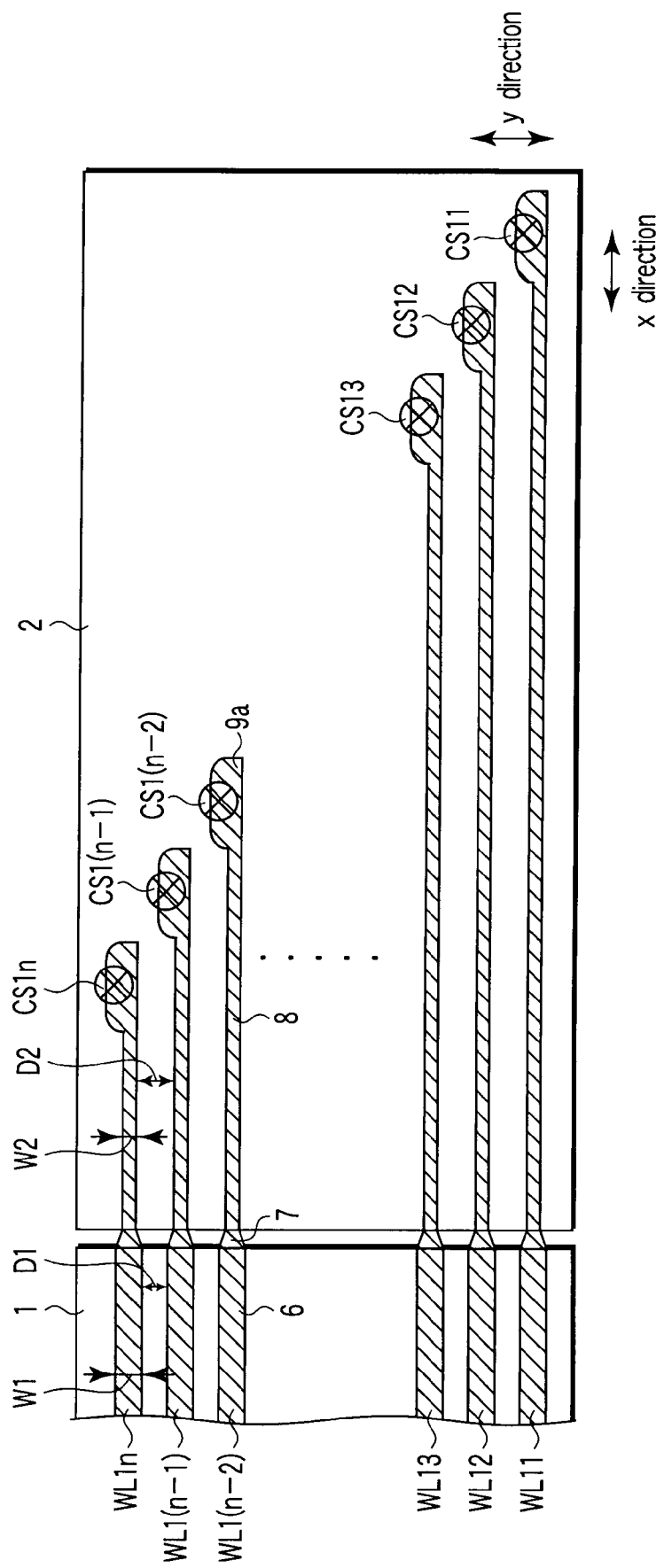
FIG. 4 is a diagram showing one example of the layout of the word lines in the lead area.

In addition, the shape of the fringe 9 is square in the example shown in FIG. 3, but is not limited thereto. For example, as shown in FIG. 4, the fringes may be fringes 9$a$ having a shape in which corners of the square are chamfered. Moreover, the fringes may be elliptical fringes 9$b$ as shown in FIG. 5, or may be circular fringes.

On the memory cell array 1, the plurality of word lines WL11 to WL1n are formed by in-memory-cell-array word line layers 6 (first conducting wire portions) having a word line width W1.

On the other hand, in the word line lead area 2 where the plurality of contact holes CS11 to CS1n are disposed, the plurality of word lines WL11 to WL1n are formed by in-lead-area word line layers 8 (second conducting wire portions) having a word line width W2.

The word line width W2 of the in-lead-area word line layer 8 (second conducting wire portion) is smaller than the word line width W1 of the in-memory-cell-array word line layer 6 (first conducting wire portion).

In order to convert the width of the plurality of word lines WL11 to WL1n from the word line width W1 to the smaller word line width W2, word line width conversion wiring line layers 7 (third conducting wire portions) are disposed at the boundary between the memory cell array 1 and the word line lead area 2 or in the word line lead area 2.

As described above, the width of the plurality of word lines WL11 to WL1n in the word line lead area 2 is smaller, such that a distance D2 between the adjacent word lines in the word line lead area 2 can be larger than a distance D1 between the adjacent word lines in the memory cell array 1.

This provides a structure in which a short circuit is not easily caused between the adjacent word lines in the word line lead area 2.

Furthermore, as the distance D2 between the adjacent word lines is larger, the sizes of the plurality of contact holes CS11 to CS1n can be larger. Thus, larger fringes can be provided.

This further makes it possible to provide a structure which does not easily cause a loose connection between the plurality of word lines WL11 to WL1n and the plurality of lead wires L11 to L1n.

As described above, the width of the plurality of word lines WL11 to WL1n in the word line lead area 2 is smaller than the width of the plurality of word lines WL11 to WL1n in the memory cell array 1, such that there is no short circuit between the word lines and no loose connection between the word line and the lead wire.

Furthermore, a decreased difficulty level of photolithography and processing of the word lines and contacts improves the operation of the memory cell array in, for example, reading data from the memory cells and improves the reliability of a semiconductor device.

(2) Second Embodiment

A second embodiment will be described using FIGS. 6 to 8. It is to be noted that the same signs are assigned to the same members as those in FIGS. 2 to 5 and these members are not described in detail.

Figure 6:
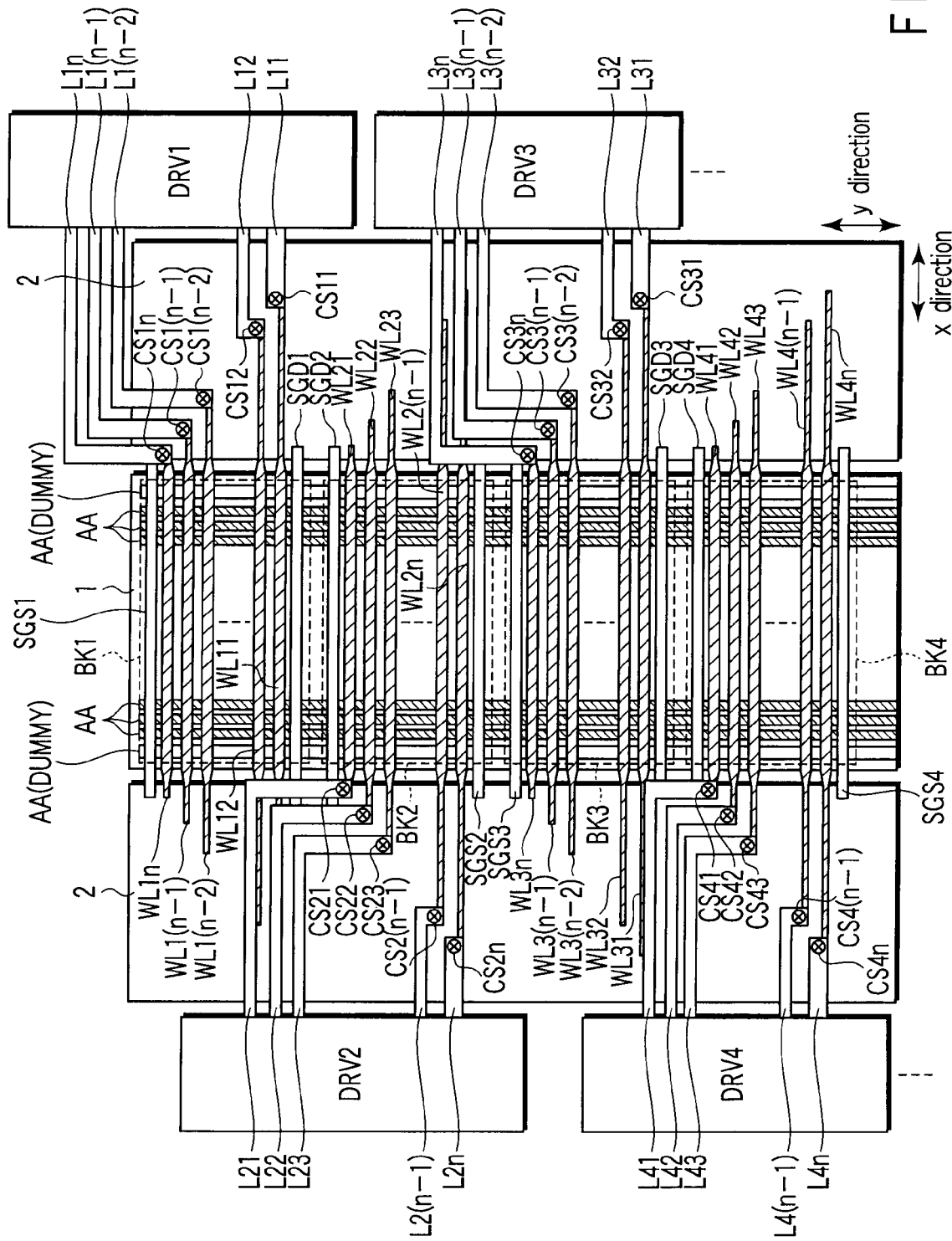
FIG. 6 is a diagram showing a layout in a second embodiment.
Figure 7:
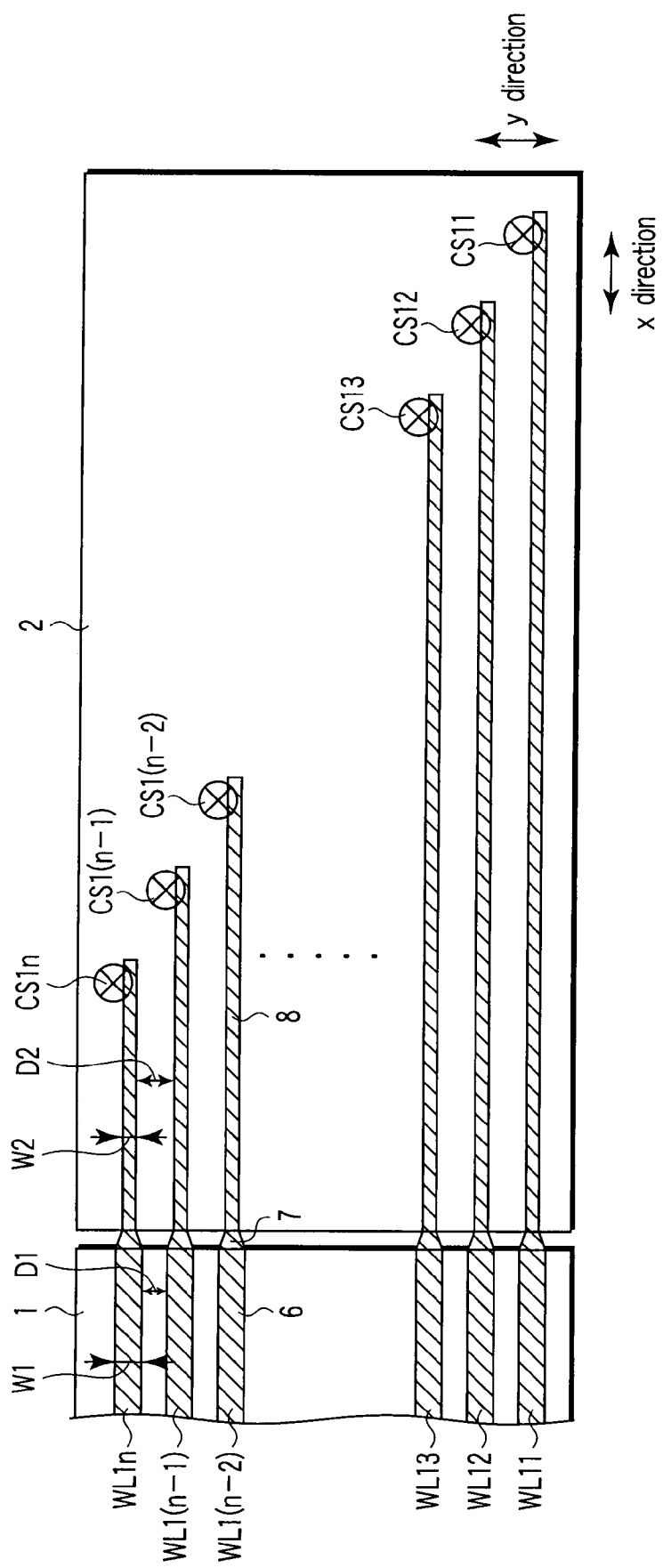
FIG. 7 is a diagram showing one example of the layout of word lines in a lead area.
Figure 8:
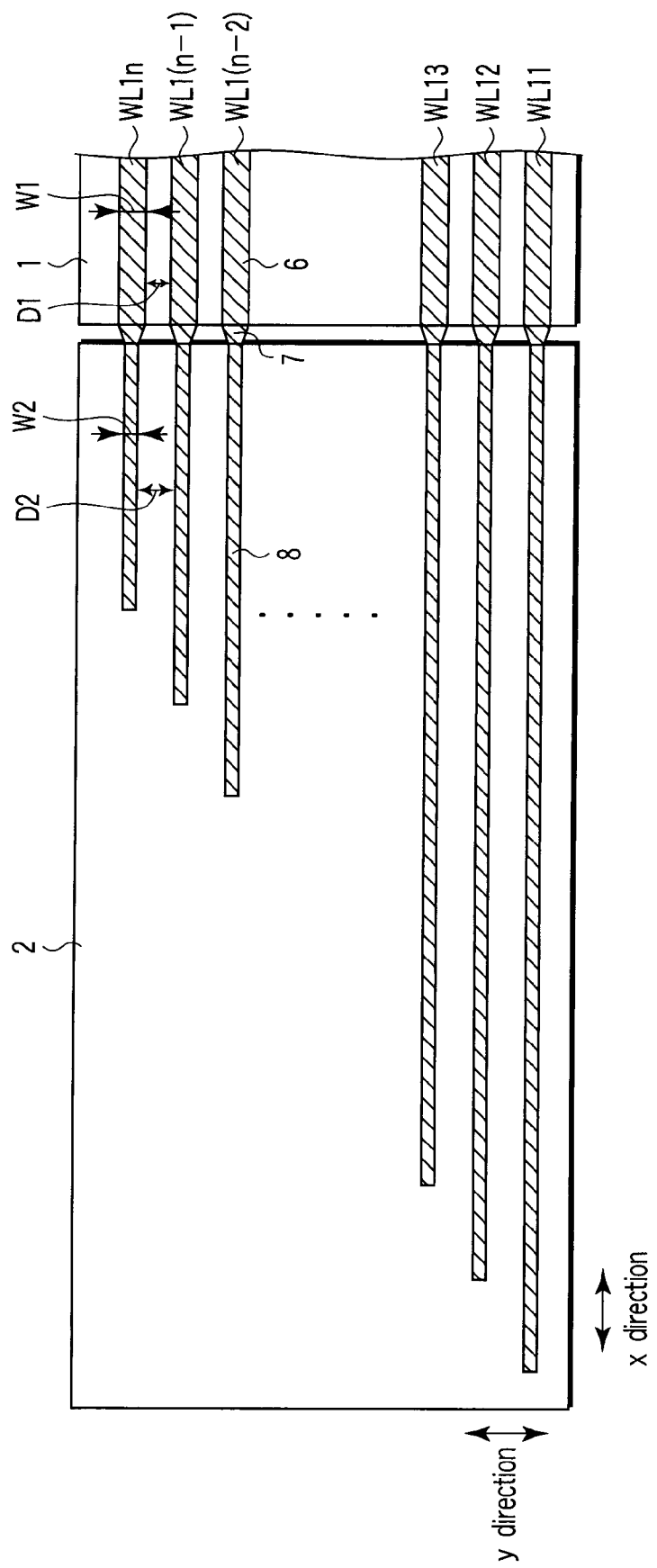
FIG. 8 is a diagram showing one example of the layout of the word lines in the lead area.

As shown in FIGS. 6 to 8, a plurality of word lines WL11 to WL1n have a single-edged shape at one end and the other in word line lead areas 2 as in the first embodiment.

In the present embodiment as well, a block BK1 shown in FIG. 6 is explained below as an example as in the first embodiment.

A plurality of contact holes CS11 to CS1n are disposed at one end of the plurality of word lines WL11 to WL1n.

The width of the plurality of word lines WL11 to WL1n in the word line lead area 2 where the plurality of contact holes CS11 to CS1n are disposed is smaller than the width of the plurality of word lines WL11 to WL1n in a memory cell array 1.

Furthermore, the other end of the plurality of word lines WL11 to WL1n is disposed in the word line lead area 2 where the plurality of contact holes CS11 to CS1n are not disposed.

In the present embodiment, the width of the plurality of word lines WL11 to WL1n at the other end is equal to the width of the plurality of word lines WL11 to WL1n at one end in the word line lead area 2.

That is, the present embodiment is different from the previous first embodiment in that the present embodiment has a pattern in which one end and the other of the plurality of word lines WL11 to WL1n are symmetrical (symmetrical in a direction in which conducting wires extend).

As shown in FIG. 7, the plurality of contact holes CS11 to CS1n are disposed at one end of the plurality of word lines WL11 to WL1n.

As in the first embodiment, the width of the plurality of word lines WL11 to WL1n is converted in the word line lead area 2 from a word line width W1 to a smaller word line width W2 by word line width conversion wiring line layers 7 (third conducting wire portions) and in-lead-area word line layers 8 (second conducting wire portions).

Furthermore, in the present embodiment, fringes as in the first embodiment are not provided, and the plurality of word lines WL11 to WL1n are connected to the plurality of contact holes CS11 to CS1n.

At this point, the central points of the plurality of contact holes CS11 to CS1n are shifted with respect to the central lines of the plurality of word lines WL11 to WL1n toward the side of conducting wires where the lengths of the plurality of word lines WL11 to WL1n extending at one end from the end of the memory cell array 1 are short.

There is no adjacent word lines on the side to which the plurality of contact holes CS11 to CS1n are shifted. This provides a structure in which the sizes of the plurality of contact holes CS11 to CS1n can be larger and in which problems such as breaking and short circuiting are not easily caused even by misalignment.

Furthermore, the sizes of the plurality of contact holes CS11 to CS1n have only to be larger than the width of the plurality of word lines WL11 to WL1n.

Moreover, no fringes are provided in a layout shown in the present embodiment. In this case, a reduction in the width of the word lines can reduce the sizes of the contact holes accordingly. Consequently, the width of a plurality of lead wires L11 to L1n can also be reduced.

On the other hand, as shown in FIG. 8, the plurality of contact holes CS11 to CS1n are not disposed at the other end of the plurality of word lines WL11 to WL1n.

In the same manner as the one end of the plurality of word lines WL11 to WL1n, the width of the other end of the plurality of word lines WL11 to WL1n is also converted in the word line lead area 2 from the word line width W1 of in-memory-cell-array word lines 6 (first conducting wire portions) to the smaller word line width W2 by the word line width conversion wiring line layers 7 (third conducting wire portions) and the in-lead-area word line layers 8 (second conducting wire portions).

The width of the plurality of word lines WL11 to WL1n can be reduced only on the side where they are connected at one end to the contact holes, in order to prevent short circuiting between the adjacent word lines and a loose connection between the word line and the lead wire.

However, as described above, the pattern of the plurality of word lines WL11 to WL1n at the other end is the same as the pattern at one end such that a symmetrical line-and-space pattern is provided. Such a configuration permits the same width at one end and the other in each of blocks BK1 to BK4.

This is significantly effective in preventing the deterioration of processing accuracy due to dimensional variations as compared with the case where patterns with different wiring line width are adjacent to each other.

As described above, owing to the layout in which the plurality of word lines WL11 to WL1n have a single-edged shape at one end and the other, the width of the memory cell array 1 in the y-direction can be sufficiently reduced, and the width of the plurality of word lines WL11 to WL1n can be reduced in the word line lead area 2, which also makes it possible to reduce the width of the lead area 2 in the y-direction.

This permits a reduced chip size and a higher storage capacity.

Moreover, the use of the symmetrical layout of the word lines can prevent the deterioration of processing accuracy due to dimensional variations.

(3) Modification

Figure 9:
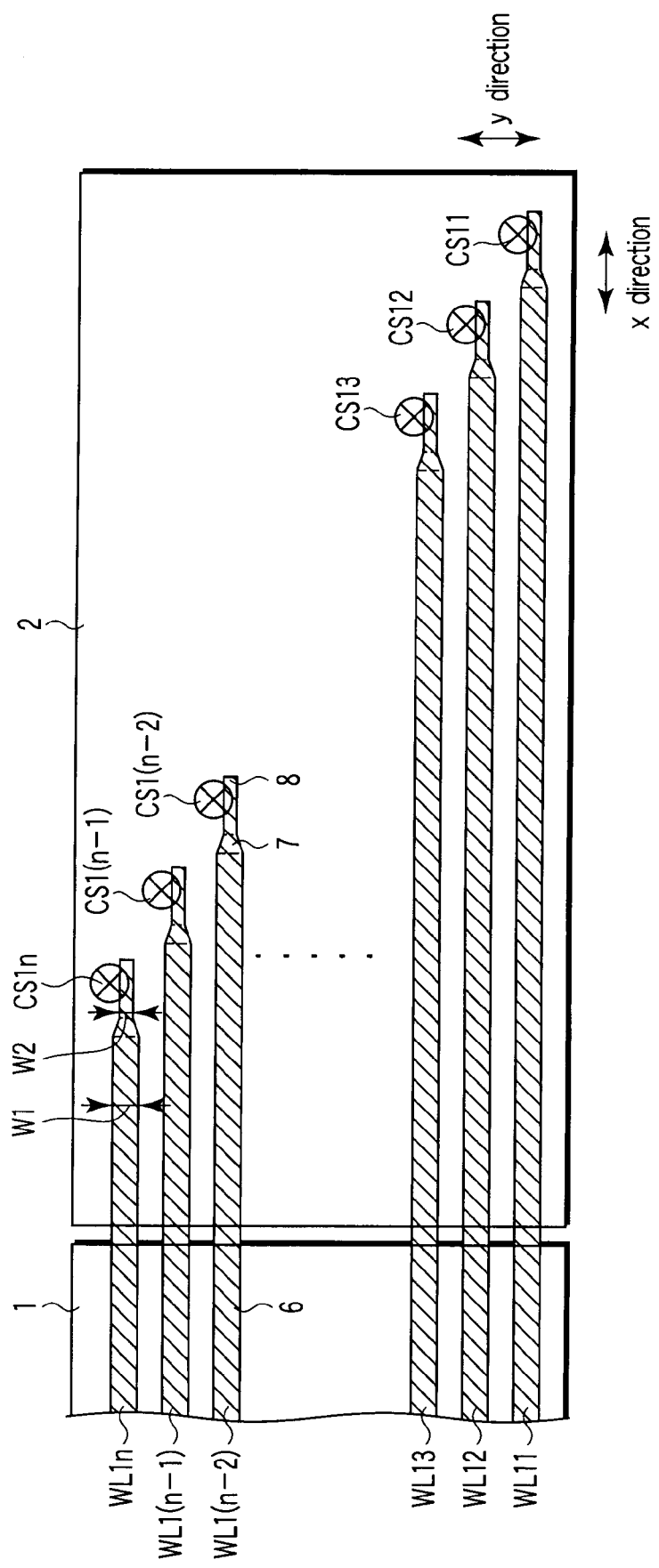
FIG. 9 is a diagram showing one example of the layout of the word lines in the lead area.
Figure 10:
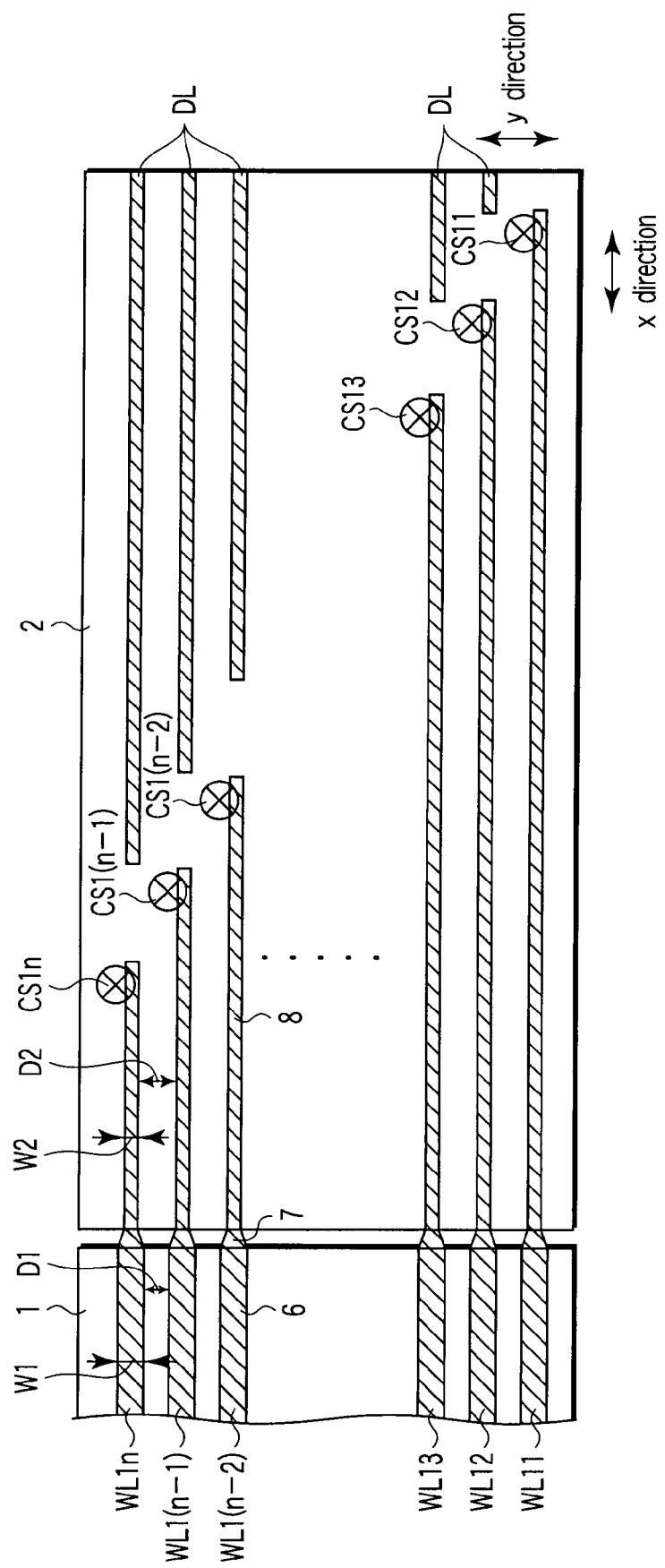
FIG. 10 is a diagram showing one example of the layout of the word lines in the lead area.
Figure 11:
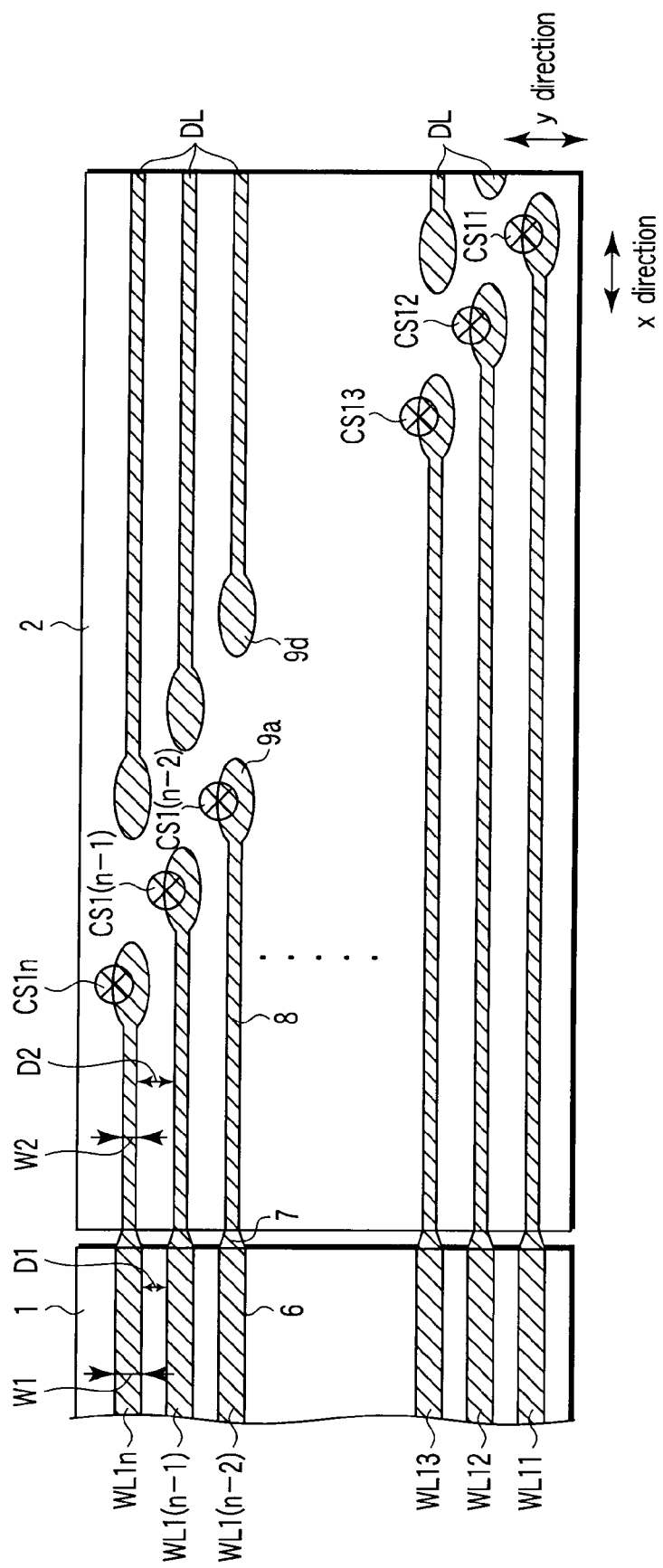
FIG. 11 is a diagram showing one example of the layout of the word lines in the lead area.

A modification of the embodiments of the present invention will be described below using FIGS. 9 to 11.

The width of a plurality of word lines WL11 to WL1n is not exclusively converted at the extreme end of a memory cell array 1. Thus, as shown in FIG. 9, the width of the plurality of word lines WL11 to WL1n may be converted so that the plurality of word lines WL11 to WL1n are drawn onto a word line lead area 2 with a word line width W1 and changed to a line width W2 within the word line lead area 2.

Furthermore, parts which do not function as the word lines are removed by etching when the plurality of word lines WL11 to WL1n are processed into a single-edged layout. However, this is not a limitation. As shown in FIG. 10, these parts may remain in the word line lead area 2 as, for example, a dummy pattern (hereinafter referred to as dummy word lines) DL of a line-and-space pattern substantially similar to the word lines WL11 to WL1n in order to serve as an extension of the word lines WL11 to WL1n. In addition, this dummy pattern is electrically separate from the word lines and does not function as word lines. Moreover, when fringes (e.g., fringes 9b) are formed in the word lines WL11 to WL1n at one end as shown in FIG. 11, patterns having about the same shape as those of the fringes 9b may be formed in the dummy word lines DL at one end. In addition, the word lines WL11 to WL1n are only shown on one side in FIGS. 9 to 11, but it should be understood that the word lines WL11 to WL1n may have a different structure on the other side from that on the one side as in the first embodiment or the word lines WL11 to WL1n may also have the same structure on the other side as in the second embodiment.

(4) Manufacturing Method

A method of manufacturing the word lines WL11 to WL1n described in the first and second embodiments and the modification is explained.

First, a gate insulating film of a memory cell transistor is formed on the surface of a semiconductor substrate by, for example, a thermal oxidation method. Then, a floating gate electrode material (e.g., polysilicon) serving as a floating gate electrode of the memory cell transistor is formed on the gate insulating film by the chemical vapor deposition (CVD) method.

Next, the polysilicon film, the gate insulating film and the semiconductor substrate are sequentially etched by, for example, a photolithographic method or the reactive ion etching (RIE) method so that, for example, an active area of a predetermined size is formed in a memory cell array, thereby forming a trench having a shallow trench isolation (STI) structure in a semiconductor substrate 1. Further, for example, a silicon oxide film is embedded in this trench to form an element separation insulating film.

Then, an inter-gate insulating film is formed on the polysilicon film serving as the floating gate electrode. Further, a control gate electrode material (e.g., polysilicon) is formed on the inter-gate insulating film by, for example, the CVD method. Then, the control gate electrode material, the inter-gate insulating film, the floating gate electrode material and a gate insulating film material are sequentially etched by, for example, the photolithographic method or the RIE method so that, for example, a line-and-space pattern of a predetermined size is formed, thereby forming stacked gate electrodes of a plurality of memory cell transistors. This gate-processed control gate electrode functions as a word line.

In this etching process for gate processing, the control gate electrode is etched and formed so that a word line width W2 of in-lead-area word line layers 8 (second conducting wire portions) is smaller than a word line width W1 of in-memory-cell-array word line layers 6 (first conducting wire portions), as shown in FIGS. 3, 4, 5 and 7.

Furthermore, simultaneously with this etching process, fringes 9, 9a, 9b shown in FIGS. 3 to 5 are formed at the ends of the word lines (control gate electrodes) WL11 to WL1n. In addition, as shown in FIGS. 10 and 11, the control gate electrode as the word lines WL11 to WL1n may be cut in part into a single-edged layout, and parts which do not function as the word lines may remain in the lead area as a dummy pattern in order to be serve as an extension of the word lines WL11 to WL1n in the x-direction.

Moreover, the fringes 9, 9a, 9b are not formed in a mask pattern for pattern transfer used in photolithography, but, depending on processing conditions, may be formed during subsequent processing using the RIE method. In this case, the lines and spaces of the mask pattern are regular, which improves a lithographic margin.

Then, a source/drain diffusion layer is formed in the semiconductor substrate in a self-aligning manner using the gate electrode of the memory cell transistor as a mask. Further, an interlayer insulating film is formed to cover the whole surface of the memory cell transistor.

Then, a plurality of contact holes are formed in the interlayer insulating film so that they contact one side of the formed word lines WL11 to WL1n. Further, contact plugs made of a high-melting-point metal such as W or Mo are embedded in the contact holes. Lead wiring lines wider than the word line width W2 of the in-lead-area word line layers 8 (second conducting wire portions) are connected onto the contact plugs.

This connects the memory cell transistor to a row decoder circuit.

In this manner, a flash memory of the embodiments of the present invention is completed.

According to the manufacturing method described above, the width of the word lines WL11 to WL1n in the word line lead area 2 can be smaller than the width of the plurality of word lines WL11 to WL1n in the memory cell array 1, thereby providing a semiconductor integrated circuit such as a flash memory free of the occurrence of short circuiting between word lines and a loose connection between a word line and the lead wire.

Furthermore, a decreased difficulty level of photolithography and processing of the word lines and contacts makes it possible to provide a semiconductor integrated circuit with the improved operation of the memory cell array in, for example, reading data from the memory cells and with improved reliability.

Moreover, it is possible to provide a semiconductor integrated circuit enabling a reduced chip size and a higher storage capacity.

3. Others

While the word lines have been described in the embodiments, it should be appreciated that the present invention is also applicable to bit lines having a line-and-space pattern.

Furthermore, the examples of the present invention are also applicable to embodiments described in a previous application (Japanese Patent Application No. 2006-012908).

According to the present invention, it is possible to prevent the short circuit and misalignment with the contact holes in the conducting wires having a line-and-space pattern and provide a higher storage capacity of the cell array.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a cell array composed of a plurality of blocks in which a plurality of elements are arrayed;
a plurality of conducting wires extending from the cell array to a lead area; and
a plurality of contact holes arranged in the lead area so that a distance from the end of the cell array sequentially increases from one to the other of the plurality of conducting wires,
each of the plurality of conducting wires having:
a first conducting wire portion;
a second conducting wire portion connected to the contact hole; and
a third conducting wire portion electrically connecting the first conducting wire portion to the second conducting wire portion, a width of the third conducting wire portion gradually decreasing from a side of the first conducting wire portion toward a side of the second conducting wire portion,
wherein an end portion of the first conducting wire portion which contacts to the third conducting wire portion extends with a first conducting wire width, and the second conducting wire portion has a second conducting wire width smaller than the first conducting wire width, and
wherein central points of the plurality of contact holes are shifted with respect to central lines of the plurality of conducting wires toward a side of conducting wires where lengths of the plurality of conducting wires extending at one end from the end of the cell array are shorter.

2. The semiconductor integrated circuit according to claim 1, wherein
one end and the other of the conducting wire have, in the plurality of blocks, a structure symmetrical in a direction in which the conducting wire extends.

3. The semiconductor integrated circuit according to claim 1, wherein a size of the contact hole is larger than the second conducting wire width.

4. The semiconductor integrated circuit according to claim 1, wherein
the lead areas are disposed across the cell array, and one end of the plurality of conducting wires is drawn from the lead areas opposite to each other in the adjacent ones of the plurality of blocks and is connected to lead wires via the plurality of contact holes, the lead wires being drawn from a driver which drives the plurality of conducting wires and being wider than the second conducting wire width.

5. The semiconductor integrated circuit according to claim 1, wherein a fringe is provided at the end of the second conducting wire portion to which the contact hole is connected.

6. The semiconductor integrated circuit according to claim 5, wherein a size of the fringe is larger than the second conducting wire width.

7. The semiconductor integrated circuit according to claim 5, wherein the shape of the fringe is square.

8. The semiconductor integrated circuit according to claim 5, wherein the shape of the fringe is elliptical.

9. The semiconductor integrated circuit according to claim 1, wherein a dummy pattern is provided as an extension of the conducting wires in the lead area.

10. The semiconductor integrated circuit according to claim 1, wherein the plurality of conducting wires are disposed with a predetermined distance from each other in the cell array and the lead area.

11. The semiconductor integrated circuit according to claim 1, wherein the first conducting wire portion is provided in the cell array.

12. The semiconductor integrated circuit according to claim 1, wherein the first conducting wire portion is connected to a memory cell transistor which is provided in the cell array and which has a stacked gate structure.

13. The semiconductor integrated circuit according to claim 1, wherein the third conducting wire portion is provided at the boundary between the cell array and the lead area.

14. The semiconductor integrated circuit according to claim 1, wherein the plurality of conducting wires are word lines.

15. The semiconductor integrated circuit according to claim 1, wherein a contact plug embedded in the contact hole is made of a material containing a high-melting-point metal.

16. The semiconductor integrated circuit according to claim 4, wherein the lead wire is made of a metal including at least one of Al, Cu or W.

17. The semiconductor integrated circuit according to claim 1, wherein the plurality of conducting wires are made of polysilicon.

18. The semiconductor integrated circuit according to claim 1, being applied to a flash memory.

19. The semiconductor integrated circuit according to claim 3, wherein the width of one end of the second conducting wire portion that is connected to the contact hole is equal to or less than the width of the other end of the second conducting wire portion which is connected to the third conducting wire portion.

20. The semiconductor integrated circuit according to claim 1, wherein the third conducting wire portion is provided in the lead area.

* * * * *